United States Patent
Fales et al.

(10) Patent No.: US 7,495,254 B2
(45) Date of Patent: Feb. 24, 2009

(54) TEST STRUCTURE AND METHOD FOR DETECTING AND STUDYING CRYSTAL LATTICE DISLOCATION DEFECTS IN INTEGRATED CIRCUIT DEVICES

(75) Inventors: Jonathan R. Fales, South Burlington, VT (US); Jerome B. Lasky, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 114 days.

(21) Appl. No.: 11/162,128

(22) Filed: Aug. 30, 2005

(65) Prior Publication Data
US 2007/0051948 A1 Mar. 8, 2007

(51) Int. Cl.
*H01L 23/58* (2006.01)
(52) U.S. Cl. .......... 257/48; 257/E23.002; 438/14; 324/158.1
(58) Field of Classification Search .......... 438/14; 257/48, E23.002; 324/158.1
See application file for complete search history.

(56) References Cited

U.S. PATENT DOCUMENTS

| | | | | |
|---|---|---|---|---|
| 3,997,368 A | | 12/1976 | Petroff et al. ............ 438/476 |
| 4,755,748 A | * | 7/1988 | Lin ........................ 250/310 |
| 5,158,907 A | | 10/1992 | Fitzgerald, Jr. ............ 438/504 |
| 5,266,380 A | | 11/1993 | Renguso et al. ............ 428/192 |
| 5,562,770 A | | 10/1996 | Chen et al. ................ 117/90 |
| 5,736,642 A | | 4/1998 | Yost et al. ................ 73/602 |
| 5,929,650 A | * | 7/1999 | Pappert et al. ............ 324/763 |
| 6,258,497 B1 | | 7/2001 | Kropp et al. ............... 430/30 |
| 6,530,991 B2 | | 3/2003 | Tanaka et al. ............. 117/89 |
| 6,716,653 B2 | * | 4/2004 | Look et al. ................ 438/14 |
| 6,730,529 B1 | * | 5/2004 | Kalter et al. .............. 438/17 |
| 7,071,628 B2 | * | 7/2006 | Albers et al. .............. 438/14 |

FOREIGN PATENT DOCUMENTS

| | | |
|---|---|---|
| JP | 2003083908 A | 3/2003 |
| JP | 2003098113 A | 4/2003 |
| WO | WO0101465 A1 | 1/2001 |

OTHER PUBLICATIONS

More About Materials Science; printed Sep. 29, 2004; http://chemed.chem.purdue.edu/genchem/topicreview/bp/materials/defects3.html; pp. 1-7.

(Continued)

*Primary Examiner*—Howard Weiss
*Assistant Examiner*—John C Ingham
(74) *Attorney, Agent, or Firm*—Downs Rachlin Martin PLLC

(57) ABSTRACT

A test structure (200, 200') having an array (224) of test devices (220) for detecting and studying defects that can occur in an integrated circuit device, e.g., a transistor (144), due to the relative positioning of one component (100) of the device with respect to another component (108) of the device. The test devices in the array are of a like kind, but vary in their configuration. The differences in the configurations are predetermined and selected with the intent of forcing defects to occur within at least some of the test devices. During testing, the responses of the test devices are sensed so as to determine whether or not a defect has occurred in any one or more of the test devices. If a defective test device is detected, the corresponding wafer (204) may be subjected to physical failure analysis for yield learning.

20 Claims, 4 Drawing Sheets

OTHER PUBLICATIONS

Isolet Kerf Structure and Math Model for Improved Sensitivity to Bipolar Leakage Components; S. N. Chakravarti and D.A. Miller; *IBM Technical Disclosure Bulletin*; vol. 26, No. 7A, Dec. 1983.

Increased Visibility of Defects in Optical Birefringent Images; J.W. Matthews and T.S. Plaskett; *IBM Technical Disclosure Bulletin*; vol. 19, No. 10, Mar. 1977.

* cited by examiner

TEST STRUCTURE AND METHOD FOR DETECTING AND STUDYING CRYSTAL LATTICE DISLOCATION DEFECTS IN INTEGRATED CIRCUIT DEVICES

FIELD OF THE INVENTION

The present invention generally relates to the field of integrated circuits. In particular, the present invention is directed to a test structure and method for detecting and studying crystal lattice dislocation defects in integrated circuit devices.

BACKGROUND OF THE INVENTION

Physical defects in semiconductor materials used to make integrated circuits (ICs) have been found to affect the performance of various devices, e.g., transistors, within the ICs. For example, dislocations in the crystal lattice of these materials play an important role in determining the electrical and mechanical properties of semiconductor materials. Experimental evidence shows that dislocations degrade the electronic properties of solid-state devices by forming intrinsic conductive paths or developing unwanted spare charges. Dislocation defects partition an otherwise monolithic crystal structure and introduce unwanted and abrupt changes in electrical and optical properties. A dislocation or a cluster of dislocations attract metallic and ionic impurities and can provide an unwanted electrically conductive path between different regions of the semiconductor device.

Generally, dislocations can develop during fabrication as a result of manufacturing processes, e.g. stress induced in a silicon substrate during the formation of shallow trench isolation (STI) structures and damage caused by implantation during formation of diffusion regions within the substrate. As examples of the former, dislocations can be caused by curvature in the bottom corners of the STI structures, intrinsic stress in the STI fill, and stress induced by oxidation after the STI trench is filled. As examples of the latter, dislocations can result from deep well implantation and end of range dislocations from extension of source/drain implantation.

As the level of integration continues to increase and, correspondingly, device feature sizes continue to decrease, dislocation defects are increasingly impacting yield. These defects can reduce device yield either by affecting the device's functionality or by increasing the current consumption under stand-by conditions. Therefore, minimizing the occurrence of dislocation defects is important in a wide variety of semiconductor devices and processes. However, oftentimes failures from dislocation defects are difficult to distinguish from other single cell failures.

Detection by conventional physical failure analysis is extremely tedious and limited. Accordingly, there is a clear need for an efficient and effective program for studying dislocation defects and their causes. It is therefore a feature of the present invention to provide an efficient architecture and circuit to cause, detect and study dislocation defects. It is a feature of the present invention to provide a method of detecting and studying dislocations and thus the data needed to make the process dislocation immune. It allows learning and monitoring of dislocation defects for yield improvement. It is a further feature of the present invention that such a method gives fast failure analysis and fast yield learning.

SUMMARY OF THE INVENTION

In one aspect, the present invention is directed to a semiconductor wafer comprising a test structure operatively configured to detect the presence of an anomaly within the test structure. The test structure comprises a plurality of like test devices each having a test response and comprising a first component and a second component in a predetermined physical relationship with the first component, wherein the predetermined physical relationship is different from the predetermined physical relationship of each other of the plurality of like test devices. Sensing circuitry operatively configured to sense the test response of each corresponding respective of the plurality of like test devices.

In another aspect, the present invention is directed to a method of studying an anomaly within a semiconductor device having a first component and a second component. The method comprises the step of providing a test device that includes a first component and a second component in a predetermined physical relationship with the first component. The test device has a test response to a test scheme. The predetermined physical relationship is selected so as to force the anomaly. The test scheme is implemented, and the test response is measured so as to determine whether the anomaly is present.

BRIEF DESCRIPTION OF THE DRAWINGS

For the purpose of illustrating the invention, the drawings show a form of the invention that is presently preferred. However, it should be understood that the present invention is not limited to the precise arrangements and instrumentalities shown in the drawings, wherein.

DETAILED DESCRIPTION OF THE DRAWINGS

In general, the present invention encompasses the study and detection of anomalies, e.g., defects such as crystal lattice dislocations, that can occur in semiconductor-based integrated circuits (ICs). Such anomalies typically occur during the fabrication of ICs due to the nature of the processing steps and the interaction of the materials in various regions of the ICs with one another. For example, as discussed in the Background section above in the context of dislocation defects, the formation of shallow trench isolation (STI) structures proximate various devices, such as transistors, can cause dislocations within the diffusion regions of the transistors, as can implantation used in forming various regions of the integrated circuitry, such as source/drain and deep-well implantation.

It has also been found that dislocations can be caused by the physical proximity and shapes of various components of devices. For example, it has been observed that dislocations within diffusion regions of transistors can occur when the edges of the patterned active regions of the gate layer (typically polysilicon) are too close to the channel regions of the transistors. Similarly, it has also been observed that the presence of long edges of the active gate layer regions that are parallel and proximate to the diffusion region are more likely to cause defects in the channel regions than the presence of shorter or non-parallel edges.

Figure 1A:
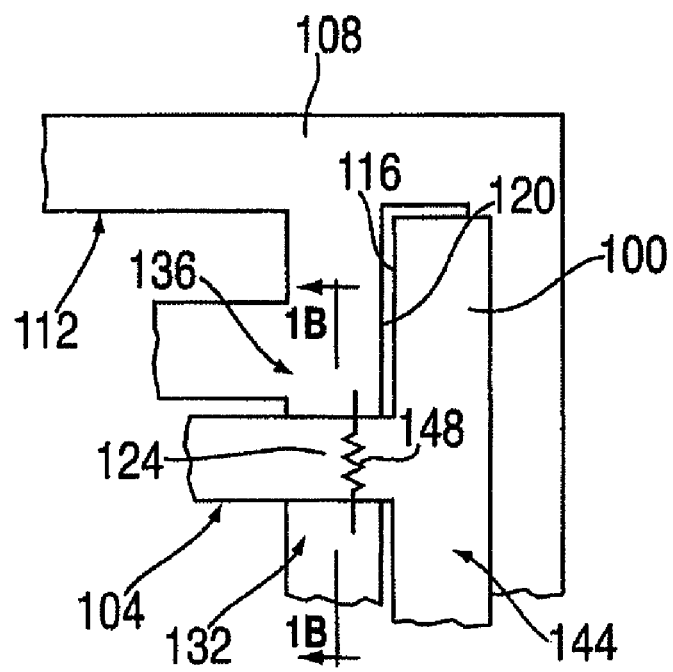
FIG. 1A is a schematic diagram of a transistor having an active gate layer and a diffusion layer illustrating a relationship between these layers that can cause one or more anomalies within the diffusion layer.

Referring to FIG. 1A, it appears that the reason that the physical proximity of an active region 100 of a gate layer 104 to a corresponding respective diffusion region 108 of a diffusion layer 112 is that during STI oxidation, the sidewall oxidation (not shown) of the active region of the gate layer grows on the sidewalls of the diffusion region and the underside of the active gate region. When the two components, i.e., active gate region 100 and corresponding respective diffusion region 108, are proximate to each other (e.g., less than 300 Å in 25 nm node technology) considerable stress is transmitted through the STI to the upper corner of the diffusion region, thereby inducing a dislocation (not shown) in the diffusion region. The situation is worse still if there is a concave shape in diffusion region 108 that lines up with end-of-range dislocations from extension implants (not shown), which, as those skilled in the art know, are implants spaced a small distance from the gate (124, FIG. 1B) such that the diffusion dopants reach under the gate and connect to the inversion layer formed in the channel (140, FIG, 1B). The tensile stress in the semiconductor material, e.g., silicon, at this corner causes the end-of-range dislocations to coalesce into an extended dislocation (not shown).

Figure 1B:
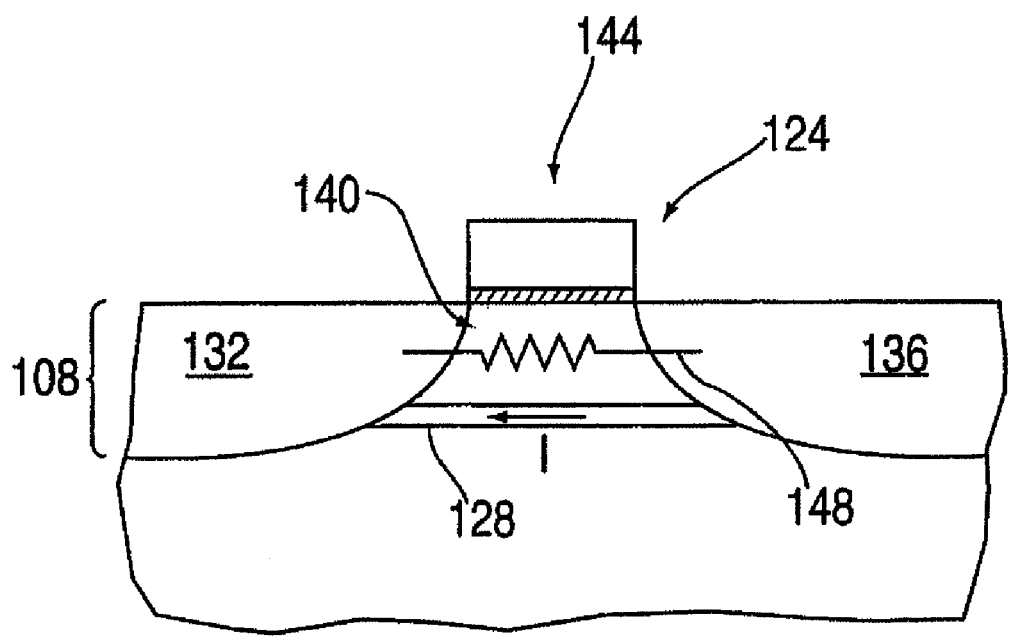
FIG. 1B is a cross-sectional view of the transistor of FIG. 1A as taken along line 1B-1B, illustrating the formation of a current leakage pipe in the channel of the resistor as a result of lattice dislocations present in the channel.

In addition, the long edge 116 of active region 100 being parallel and proximate to the long edge 120 of diffusion region 108 appears to add an additional force to direct the extended dislocation to glide under the gate 124, where, as shown in FIG. 1B, the dislocation results in a "pipe" 128 forming between the source 132 and drain 136 under the gate. Generally, pipe 128 is evidenced by the rapid diffusion of dopant atoms from source 132 and/or drain 136 across the channel 140 of the transistor 144. The practical result of the formation of pipe 128 is that current leaks between source 132 and drain 136, effectively placing a resistor 148 in series with transistor 144. Of course, such current leakage is undesirable in that it can affect manufacturing yield.

Figure 2A:
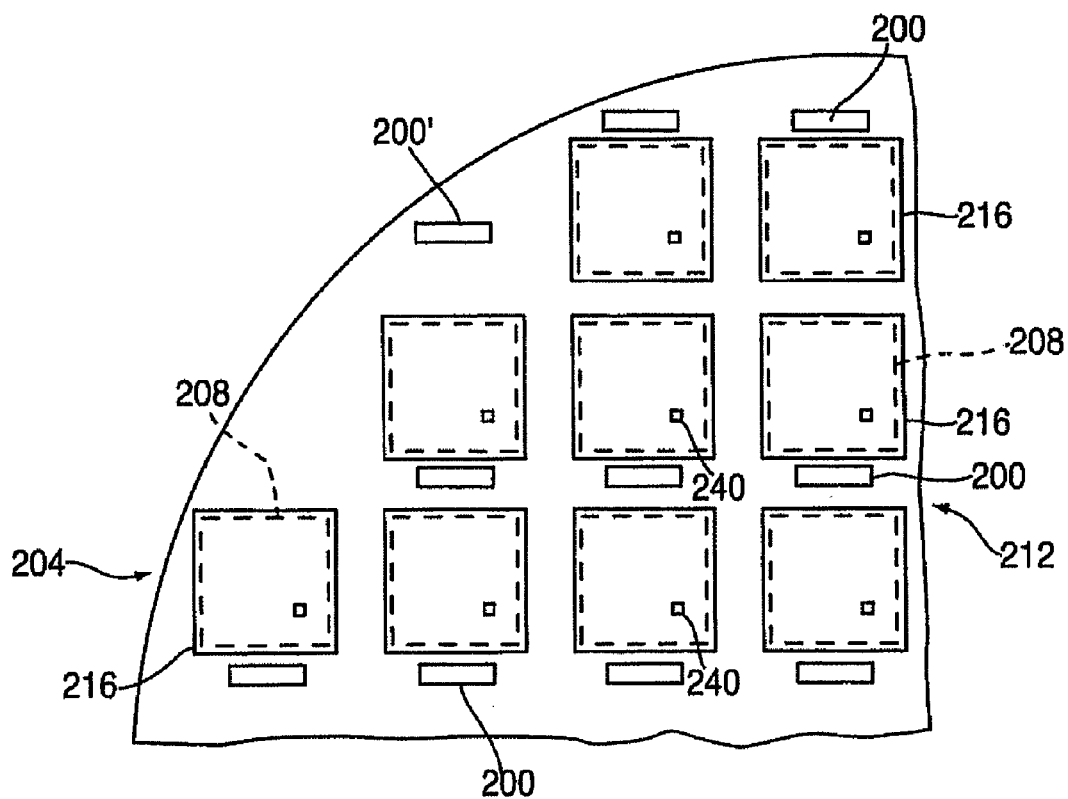
FIG. 2A is a partial high-level schematic diagram illustrating a wafer containing a plurality of anomaly test structures of the present invention.
Figure 2C:
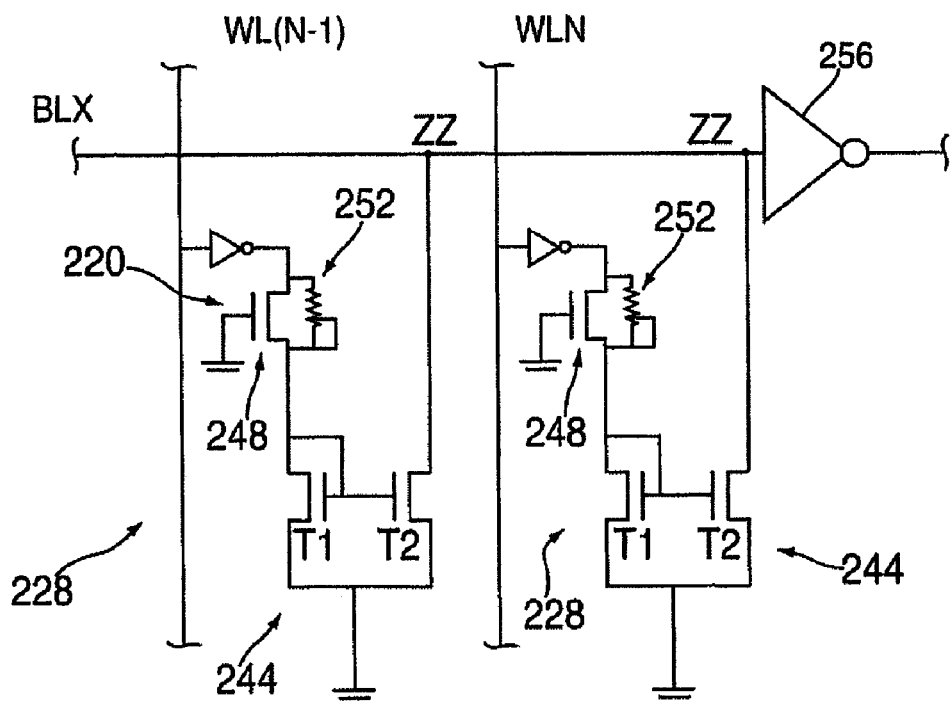
FIG. 2C is a partial enlarged high-level schematic diagram of a pair of test cells of the test cell array of FIG. 2B.
Figure 2B:
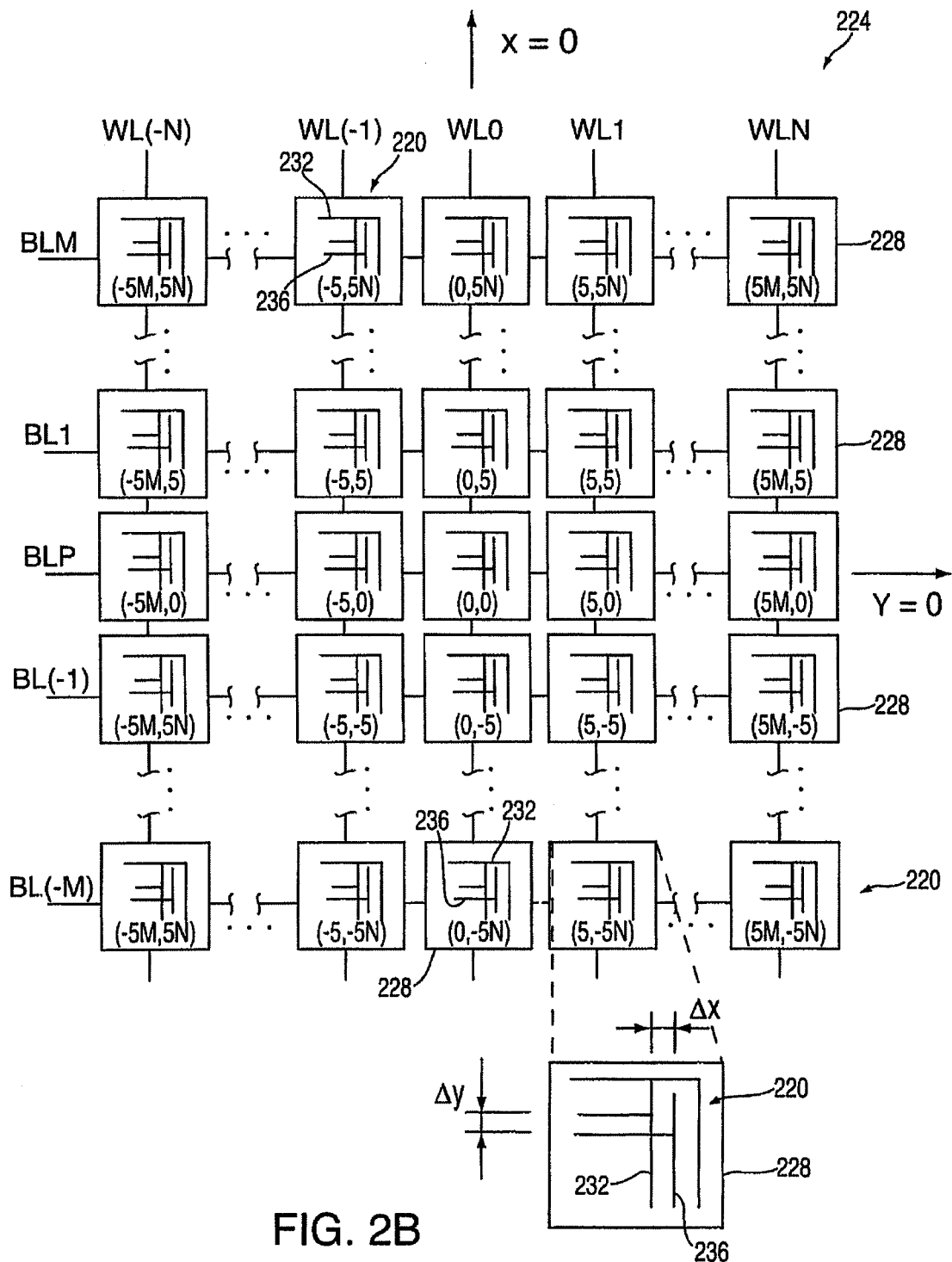
FIG. 2B is an enlarged high-level schematic diagram illustrating a test cell array of one of the anomaly test structures of FIG. 2A.

Following is an example illustrating one aspect of the present invention in the context of detecting and studying semiconductor material lattice dislocations that cause current leakage in transistors, such as transistor 144 of FIGS. 1A and 1B. Referring to FIG. 2A, in this example, one or more test structures 200, 200' of the present invention may be fabricated on a semiconductor wafer 204, either alone or along with any other ICs 208 that may be desired to be fabricated on that wafer. In one embodiment, each test structure 200 is located in a kerf 212 between adjacent die regions 216. Of course, test structures 200 may be located anywhere on wafer 204 desired, such as in the peripheral region 214 of the wafer like test structure 200'. As seen in FIG. 2B, each test structure 200, 200' may comprise a plurality of test devices 220, in this example transistors, that may be arranged, e.g., in an array 224 of test cells 228. As will be seen below, arranging test cells 228 in an array, such as array 224, lends itself to testing the array in a manner similar to reading and writing a random access memory using a grid of bitlines BL(–M) to BLM and wordlines WL(–N) to WLN.

Generally, the broad concept behind each test structure 200, 200' is to provide a multiplicity of test devices 200 having slightly different configurations from one another. The difference(s) in configuration are predetermined and selected with the intent of causing an anomaly (in this case one or more dislocations that cause current leakage) in at least one of test devices 220 and of providing additional test devices that provide a platform for scientifically studying the effects of one or more variables believed or known to affect the formation of defects or other anomalies.

For example, in FIG. 2B each test device 220 is substantially the same as transistor 144 of FIGS. 1A and 1B, but with different offsets Δx, Δy between diffusion regions 232 and active gate regions 236 in both an x-direction and a y-direction. Since in the present example there are two variables being investigated, an x,y Cartesian plane array configuration is very suitable (but not necessary) for: a) locating a test device having nominal x- and y-offsets at the center position (0,0) of the array; b) selecting one or more offset increments; and c) varying the locations of the other test devices according to the value of their offsets by incrementing or decrementing the offsets relative to their position in the x,y Cartesian plane. For example, say for a given technology an appropriate offset increment for both the x- and y-directions is 5 nm. Then, array 224 of test devices 220 would have the offset profile shown in FIG. 2B, where the numerals shown are the differences between the actual x- and y-offsets and the respective nominal x- and y-offsets at the Cartesian location (0,0). In the present example, the regularity of test devices within array lends itself to highly structured testing and statistical analysis. The nominal offsets and increment(s) may be selected as a function of the technology used to fabricate test devices 220 and/or other ICs 208 (FIG. 2A) aboard wafer 204.

For example, the nominal offsets may be the as-designed distances from the layout of ICs 208 intended to contain devices 240 similar to test devices 220. Alternatively, the nominal offsets may be the offsets that prior analysis indicates has lead to defects in prior manufactured devices (not shown). The offset increment(s) may be selected so as to provide a reasonable number of test devices, while providing the precision necessary to achieve meaningful test results for a given technology. One method of choosing the offset increment would be to make it a fraction of the alignment tolerance for the technology being used, so that the worst case alignment, which has been designed into the structure, will be assured to occur on at least some wafers. As an example, if the over-lay tolerance of the technology is 0.07 um, then the index distance might be chosen to be 0.02 um. Those skilled in the art will readily understand how to select the nominal offset value(s) and offset increment(s) once it is know what technology, processes devices, anomalies, etc. are at issue.

Once array 224 (or other configuration) of test devices 220 has been manufactured, each test device may be subjected to testing in order to determine one or more of its functional properties. Since it can beneficial to test each test device 220 under conditions similar to conditions that like devices would experience during normal operation of the IC they are in, the testing scheme may be conducted using test signals that replicate normal operating conditions. (Of course, however, other test signals may be used, depending upon the particular study conducted.) The functional property(ies) may be determined by measuring a test response of each test device 220. The measured test response may then be compared to an expected response, i.e., the response of the test device without any anomalies present. The magnitude of the difference between the test response of each test device 220 and the expected response may be used to determine whether or not an anomaly is present in that test device.

For example, in the context of each test structure 200, 200' of FIG. 2A in which test devices 220 are transistors and the anomalies under consideration are dislocations that may occur in the transistor channels, the test response measured is the current leakage through each channel when the corresponding gate is closed. FIG. 2C illustrates one scheme for measuring the closed gate leakage current of each test device 220. In FIG. 2C, each test cell 228 may include a current amplifier device 244 for amplifying the leakage current (test response) of the corresponding test device 220, which in FIG. 2C is shown as consisting of a transistor 248 and a variable resistor 252. In this figure, transistor 248 represents test device 220 and variable resistor 252 represents the resistance across the channel of the test device that may vary depending upon, among other things, whether or not one or more dislocations are present in the channel of the transistor.

Globally, the outputs of current amplifier devices 244 may be electrically connected to an appropriate bitline BL2, which may include a global sense amplifier 256, which presents the test results in a digital format. This is accomplished if the current through test device 220, i.e., the current due to resistor 252 (i.e., anomaly) when transistor 248 is "off," chargers the gates of transistors T1 and T2 sufficiently such that transistor T2 is able to pull down node ZZ. The design point of T1 and T2 may be selected to be, e.g., the maximum current leakage acceptable for test device 220 under consideration. Those skilled in the art will readily understand not only how to select an appropriate design point, but also how to select the properties of transistors T1, T2 in order to achieve the desired design point.

Figure 2D:
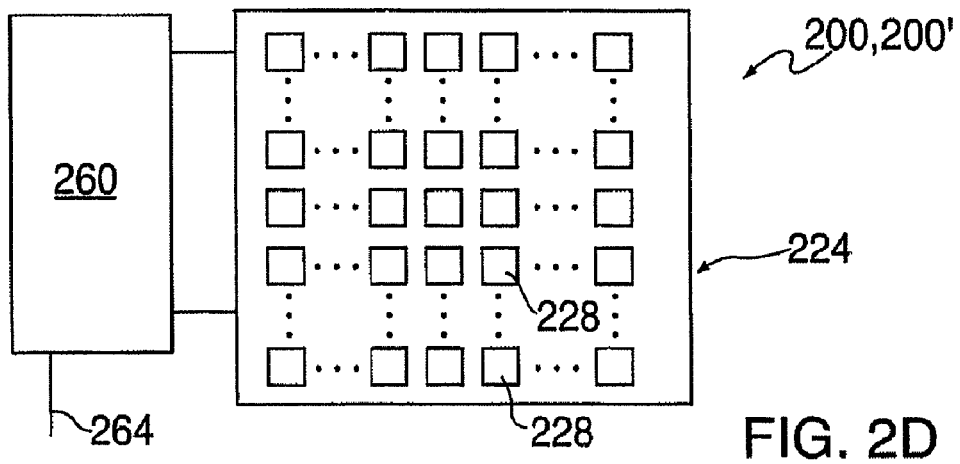
FIG. 2D is an enlarged high-level schematic diagram illustrating built-in self test circuitry of one of the anomaly test structures of FIG. 2A.

Referring now to FIG. 2D, each test structure 200, 200' may further include built-in self test (BIST) circuitry 260 in electrical communication with array 224. BIST circuitry 260 may be operatively configured, using techniques known in the art, so as to allow for automatic invocation of the testing procedure, which provides appropriate test signals to array 224 and store or report the performance of the array. For example, BIST circuitry 260 may be configured to store the location(s) of failing test cells 228 for later retrieval or sending to testing equipment (not shown). Alternatively, e.g., BIST circuitry 260 may include a single pass/fail pin 264 that provides an appropriate signal indicating either that all test cells 228 in array 224 have passed or at least one of the test cells has failed.

If test data has been collected, this data can be used in a number of beneficial ways. For example, stored location(s) of failing test cells 228 can be used in subsequent physical failure analysis to pinpoint the exact location of the failure. In the present example, based on the design of array 224 and current amplifier devices 244, a cell failure should indicate the presence of a channel dislocation or other anomaly that causes excessive current leakage. Consequently, a technician can analyze each failed test device 220 (FIG. 2B) in order to confirm the presence of the dislocation or to determine the anomaly that caused the corresponding test cell 228 to fail. In addition, the use of the rectangular array architecture for test structures 200, 200' may aid the technician in quickly locating any anomalies 252 present in array 224.

Alternatively, or in addition, knowing the failure profile of array 224 and the x- and y-offsets of the failed and acceptable test devices 220 (FIG. 2B), a designer can determine whether or not and/or how to modify design rules so as to minimize the likelihood that fatal dislocations will occur in ICs containing devices similar to the test devices and made using the same technology and processes used to make the test devices. For example, if testing using any one or more of test structure(s) shows that if dislocations are likely to occur when [x-offset<250 nm and y-offset<220 nm], when [x-offset<200 nm when y-offset>260 nm] or when [y-offset<190 nm when x-offset>290 nm], the designer can implement design rules that take these conditions into account.

Those skilled in the art will readily appreciate that in other embodiments, a wafer may include a plurality of like test structures, or portions thereof, e.g., the arrays, located at substantially the same location on the wafer or, alternatively, located at substantially different locations on the wafer. The former case may be implemented, e.g., in performing statistical analyses on the test devices, while minimizing any impact of location-dependent variation in wafer processing, such as can occur with photolithography and other processes. The later case may be implemented, e.g., in determining the effect, if any, of location-dependent processing variation(s), such as can occur with lithography, on the formation of the anomaly(ies) under consideration. In addition, those skilled in the art will readily understand that in other embodiments it may be desirable to provide multiple differing test structures, or portions therefor, e.g., the arrays, on a wafer. For example and in the context of transistors, if there are several configurations of diffusion layers and gate layers, e.g., central and edge configurations, that may occur within an array of such devices, e.g., in a static random access memory, each configuration can be tested in one or more test structures or arrays in a manner similar to the manner discussed above.

Figure 3:
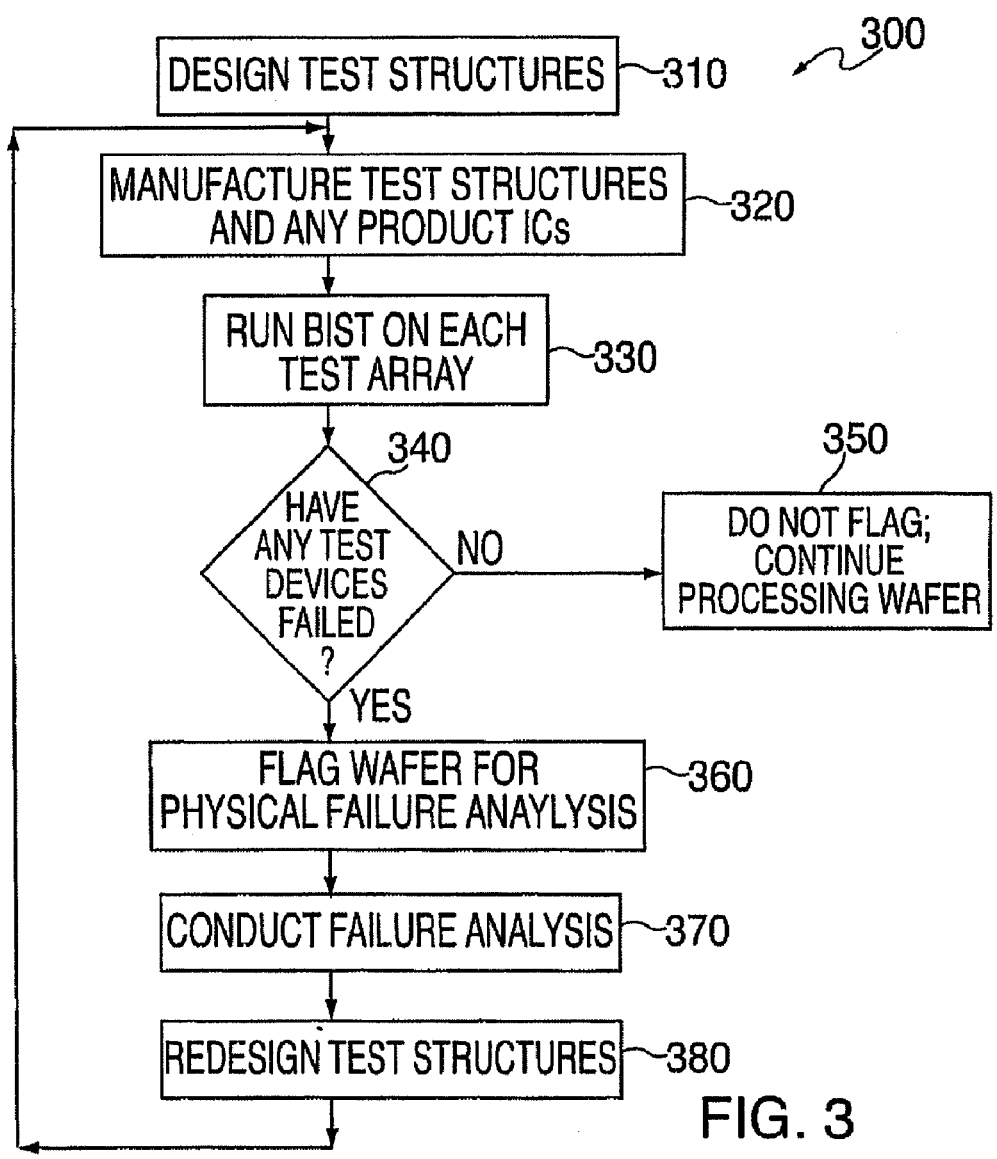
FIG. 3 is a flow diagram of an integrated circuit manufacturing method of the present invention.

Referring now to FIG. 3 and also to FIGS. 2A-2D, FIG. 3 illustrates a manufacturing method 300 that utilizes test structures of the present invention, e.g., test structures 200 of FIGS. 2A-2D. At step 310, each test structure 200 is designed so that the design rules of its test cells 228 cover a range that encompasses the design rule(s) that affect the formation of transistor channel dislocation defects (which as discussed above can result in excessive current leakage) and that are used to manufacture product ICs, e.g., ICs 208 of FIG. 2A aboard wafer 204. At step 320, each test structure 200 is manufactured along with product ICs 208 using the appropriate technology and processing. Once test structures 200 have been manufactured, at step 330 BIST circuitry 260 of each test structure is energized so as to effect testing of test devices 220 in the corresponding test array 224. At step 340, it is determined whether or not any one or more test devices 220 among the multiple test structures 200 have failed, thereby indicating in the manner discussed above that one or more channel dislocation defects have occurred. If it is determined that no test devices 220 have failed, at step 350 wafer 204 continues to be processed as required to ready the individual product ICs 208 for packaging and/or other steps.

However, if at step 340 it is determined that any one or more test devices 220 in any one of test structures 200 has failed, e.g., by reading the stored in BIST circuitry 260 or reading the state of pass/fail pin 264, etc., at steps 360 and 370 the corresponding wafer 204 may be, respectively, flagged for physical failure analysis and subjected to failure analysis and yield learning based on the results of the failure analysis. At step 380, new versions of test structures 200 having new designs based on the yield learning from the failed wafer 204 may be manufactured and steps 330, 340, 360, 370, 380 or steps 330, 340, 350 repeated as many times as required until no defects are found to exist at step 330.

While the focus of the foregoing example is on the relative locations of a first component (e.g., active region of a gate layer) to a second component (e.g., diffusion region of a diffusion region), those skilled in the art will appreciate that other parameters in the structure could be varied. For example, serifs could be used to vary the inside curvature of the STI. It should also be understood that the present invention may also be used varied to accentuate stress and dislocations. For example, the gate sidewall oxidation could be extended to grow a thicker sidewall oxide to determine how close the process is to the threshold for creating dislocation.

In addition, although the present invention has been described in the context of detecting and studying lattice dislocations, those skilled in the art will readily appreciate that the techniques and structures of the invention may be modified for detecting and studying other anomalies. For example, the present invention may be used to study and detect anomalies such as the channeling of ions through polysilicon grains in a transistor gate, defects in a spacer that causes a source/drain extension or main source/drain implant to encroach on the channel, or notches in a polysilicon gate, among others. To enhance detection of these anomalies, the gate channel may be designed at the minimum supported by the technology used to fabricate them.

Furthermore, though the invention has been described and illustrated with respect to an exemplary embodiment thereof, it should be understood by those skilled in the art that the foregoing and various other changes, omissions and additions may be made therein and thereto, without parting from the spirit and scope of the present invention.

What is claimed is:

1. A semiconductor wafer, comprising:
   a test structure operatively configured to detect the presence of a semiconductor material lattice dislocation defect within said test structure, said test structure comprising a plurality of test devices each having a test response and comprising:
   a first component;
   second component in a predetermined physical relationship with said first component, wherein said predetermined physical relationship is different from said predetermined physical relationship of each other of said plurality of test devices; and
   sensing circuitry operatively configured to sense said test response of each corresponding respective one of said plurality of test devices.

2. A semiconductor wafer according to claim 1, wherein each of said plurality of test devices is a transistor.

3. A semiconductor wafer according to claim 1, wherein said first component comprises a diffusion region and said second component comprises a polysilicon region.

4. A semiconductor wafer according to claim 3, wherein said physical relationship is expressed as a first offset between said first and second components in a first direction and a second offset between said first and second components in a second direction that is perpendicular to said first direction.

5. A semiconductor wafer according to claim 1, wherein said physical relationship comprises a physical distance between said first component and said second component.

6. A semiconductor wafer according to claim 1, wherein said sensing circuitry comprises a plurality of sense amplifiers each corresponding to a respective one of said plurality of test devices.

7. A semiconductor wafer according to claim 1, further comprising built-in self-test (BIST) circuitry in communication with said plurality of like test devices, said BIST circuitry configured to detect failure of one or more of said plurality of like test devices caused by said semiconductor material lattice dislocation defect.

8. A test structure for detecting a physical defect in an integrated circuit device, said structure comprising:
   a first layer of a first material having a first specified geometry;
   a second layer of a second material having a second specified geometry that interacts with said first layer during fabrication processing, wherein said first specified geometry and said second specified geometry are positioned in a predetermined physical relationship selected so as to force a semiconductor material lattice dislocation defect to occur in at least one of one of said first and second layers; and
   sensing circuitry in communication with at least one of said first layer and said second layer so as to form an integrated circuit, said sensing circuitry operatively configured to sense the occurrence of said semiconductor material lattice dislocation defect in said at least one of said first and second layers.

9. A test structure according to claim 8, wherein said sensing circuitry is operatively configured to sense current leakage resulting from said semiconductor material lattice dislocation defect.

10. A test structure according to claim 8, further comprising built-in self-test (BIST) circuitry configured to detect failure of the integrated circuit device caused by said semiconductor material lattice dislocation defect.

11. A semiconductor wafer, comprising:
    a plurality of test devices located onboard the semiconductor wafer for testing for occurrence of a targeted anomaly in at least one of said plurality of test devices, said plurality of test devices having corresponding respective configurations differing from one another in a manner selected so as to cause the targeted anomaly in at least one of said plurality of test devices, each of said plurality of test devices having a test response; and
    sensing circuitry located onboard the semiconductor wafer and in communication with said plurality of test devices so as to sense each said test response.

12. A semiconductor wafer according to claim 11, wherein each of said plurality of corresponding respective configurations includes a first component and a second component in a predetermined physical relationship to said first component, said predetermined physical relationship varying among said plurality of test devices.

13. A semiconductor wafer according to claim 12, wherein said first component comprises a diffusion region and said second component comprises a polysilicon region.

14. A semiconductor wafer according to claim 12, wherein said predetermined physical relationship comprises an offset distance between said first component and said second component.

15. A semiconductor wafer according to claim 14, wherein one of said plurality of test devices has a nominal offset, others of said plurality of test devices having positive offsets relative to said nominal offset and yet others of said plurality of test devices having negative offsets relative to said nominal offset.

16. A semiconductor wafer according to claim 14, wherein said predetermined physical relationship comprises a first offset distance between said first component and said second component and a second offset distance between said first component and said second component.

17. A semiconductor wafer according to claim 16, wherein said plurality of test devices are arranged in an addressable Cartesian grid as a function of said first and second offset distances.

18. A semiconductor wafer according to claim 11, wherein said anomaly is a semiconductor lattice dislocation defect and sensing circuitry comprises a plurality of sense amplifiers each corresponding to a respective one of said plurality of test devices for sensing said test response.

19. A semiconductor wafer according to claim 18, wherein each of said plurality of test devices is a field-effect transistor that includes a channel, said test response being a function of current flowing through said channel.

20. A semiconductor wafer according to claim 11, wherein said sensing circuitry includes a built-in self-test (BIST) circuitry located on board the wafer and in communication with said plurality of test devices, said BIST circuitry configured to detect said test response.

* * * * *